(12) United States Patent
Yun et al.

(10) Patent No.: US 12,382,796 B2
(45) Date of Patent: Aug. 5, 2025

(54) ORGANIC LIGHT-EMITTING DISPLAY APPARATUS

(71) Applicant: LG Display Co., Ltd., Seoul (KR)

(72) Inventors: Min Seong Yun, Paju-si (KR); Kyung Su Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 473 days.

(21) Appl. No.: 17/968,542

(22) Filed: Oct. 18, 2022

(65) Prior Publication Data

US 2023/0172012 A1    Jun. 1, 2023

(30) Foreign Application Priority Data

Nov. 26, 2021  (KR) .......................... 10-2021-0166012

(51) Int. Cl.
| | | |
|---|---|---|
| H01L 27/32 | (2006.01) |
| H01L 27/12 | (2006.01) |
| H10D 30/67 | (2025.01) |
| H10D 86/40 | (2025.01) |
| H10D 86/60 | (2025.01) |
| H10K 59/121 | (2023.01) |
| H10K 59/126 | (2023.01) |

(52) U.S. Cl.
CPC ....... *H10K 59/126* (2023.02); *H10D 30/6723* (2025.01); *H10D 30/6755* (2025.01); *H10D 86/423* (2025.01); *H10D 86/60* (2025.01); *H10K 59/1213* (2023.02)

(58) Field of Classification Search
CPC ............. H10K 59/126; H10K 59/1213; H10K 59/121; H10D 86/423; H10D 86/40; H10D 86/60; H10D 30/67; H10D 30/6755; H10D 30/673
See application file for complete search history.

(56) References Cited

U.S. PATENT DOCUMENTS

2022/0052140 A1* 2/2022 Choi ................... H10K 59/126
2024/0365649 A1* 10/2024 Guo ................... H10K 59/8792

* cited by examiner

*Primary Examiner* — Nikolay K Yushin
(74) *Attorney, Agent, or Firm* — Fenwick & West LLP

(57) ABSTRACT

An organic light-emitting display apparatus is disclosed. In particular, a driving thin film transistor and a first switching thin film transistor disposed in a subpixel of a display region each include an oxide semiconductor pattern as an active layer, and the driving TFT includes a shield pattern capable of shielding an electric field between the oxide semiconductor pattern and a gate electrode, thereby making it possible to implement a driving TFT capable of expressing rich grayscale even at low gray levels.

17 Claims, 5 Drawing Sheets

FIG. 6A
| Doping [atoms/cm³] | $10^{15}$ | $10^{17}$ | $10^{19}$ | $10^{21}$ |
|---|---|---|---|---|
| SS [V/dec] | 0.22 | 0.33 | 0.36 | 0.37 |
FIG. 6B
| NUMBER OF UNIT SPS | 1 | 3 | 5 | 7 |
|---|---|---|---|---|
| SS [V/dec] | 0.25 | 0.31 | 0.35 | 0.37 |
FIG. 7A
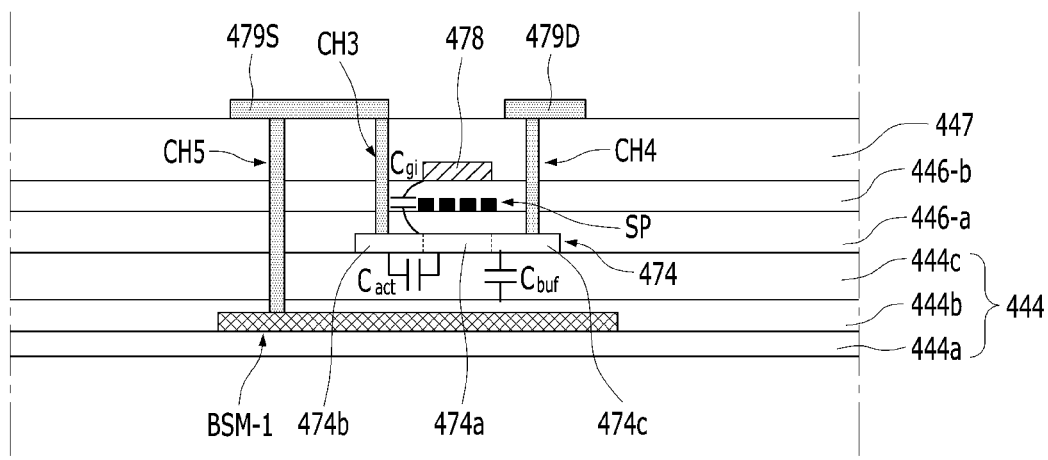
FIG. 7B
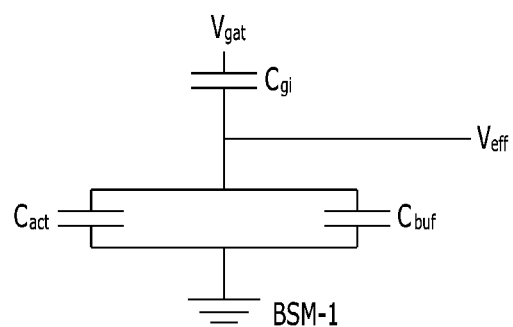

ORGANIC LIGHT-EMITTING DISPLAY APPARATUS

CROSS-REFERENCE TO RELATED APPLICATION

This application claims the benefit of Republic of Korea Patent Application No. 10-2021-0166012, filed on Nov. 26, 2021, which is hereby incorporated by reference in its entirety.

FIELD OF TECHNOLOGY

The present disclosure relates to an organic light-emitting display apparatus, and more particularly, to an organic light-emitting display apparatus capable of realizing a wide range of grayscale expression and fast ON-OFF operation by controlling an S-factor of a driving thin film transistor (TFT) among a plurality of TFT.

BACKGROUND

Recently, with the development of multimedia, the importance of flat panel display devices has been increasing. In response thereto, flat panel display devices such as a liquid crystal display device, a plasma display device, and an organic light-emitting display apparatus have been commercialized. Among these flat panel display devices, organic light-emitting display apparatuses are currently widely used due to the high response speed, high luminance, and excellent viewing angle thereof.

In such an organic light-emitting display apparatus, a plurality of pixels is disposed in a matrix arrangement in a display region, and each pixel is provided with a light-emitting element part represented by an organic light-emitting layer and a pixel circuit part represented by a TFT. The pixel circuit part includes a plurality of TFTs, such as a driving TFT for supplying a driving current to operate an organic light-emitting and a switching TFT for supplying a gate signal to the driving TFT.

In addition, a gate-driving circuit part for providing a gate signal to a pixel may be disposed in a non-display region of the organic light-emitting display apparatus. The gate-driving circuit part may be configured as a CMOS type formed as an n-type TFT and a p-type TFT in a pair.

As described above, since the plurality of TFTs disposed in the pixel circuit part in the display region and the gate-driving circuit part in the non-display region, performs different functions, electrical characteristics thereof need to be different from each other. To vary the electrical characteristics of the plurality of TFTs disposed in the pixel, a plurality of TFTs made of different structures or different semiconductor materials may be formed. However, in this case, the manufacturing process becomes complicated and manufacturing costs increase.

SUMMARY

Accordingly, the present disclosure is directed to an organic light-emitting display apparatus that substantially obviates one or more problems due to limitations and disadvantages of the related art.

An object of the present disclosure is to provide an organic light-emitting display that enables rich grayscale expression and fast switching.

Additional advantages, objects, and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these objects and other advantages and in accordance with the purpose of the present disclosure, as embodied and broadly described herein, an organic light-emitting display apparatus includes a substrate including a first region and a second region, a first TFT disposed in at least one of the first region and the second region, a second TFT disposed in the second region, the second TFT including a first oxide semiconductor pattern, and an organic light-emitting device connected to the second TFT, in which the second TFT includes a shield pattern disposed between a second gate electrode and the first oxide semiconductor pattern, and the shield pattern includes a transmissive region and a shielding region.

The substrate may include a display region and a non-display region formed around the display region, the first region may be disposed in at least one of the display region and the non-display region, and the second region may be disposed in the display region.

The first TFT may include a first polycrystalline semiconductor pattern.

The organic light-emitting display apparatus according to the present disclosure may further include a third TFT disposed in the display region, the third TFT including a second oxide semiconductor pattern, in which the second TFT may be a driving TFT configured to drive a pixel, and the third TFT may be a switching TFT configured to apply a data signal to the second TFT.

The driving TFT may include a first light-blocking pattern overlapping the first oxide semiconductor pattern below the first oxide semiconductor pattern.

The shield pattern may be a conductor.

The shield pattern may be a silicon layer doped with impurities to have conductivity.

The silicon layer may be selected from a polycrystalline semiconductor material or an oxide semiconductor material.

The shielding region may be uniformly disposed at a center and an edge of the shield pattern. Further, the shielding region may be more densely disposed at an edge of the shield pattern than at a center of the shield pattern.

The driving TFT may include a source electrode and a drain electrode disposed on the first oxide semiconductor pattern, and the source electrode may be connected to the first light-blocking pattern.

An inorganic layer including silicon nitride may be interposed between the first light-blocking pattern and the first oxide semiconductor pattern.

The first light-blocking pattern may be at least one metal layer including titanium.

An organic light-emitting display apparatus according to the present disclosure may comprises: a substrate including a display region and a non-display region formed around the display region; and a driving TFT (thin film transistor) disposed in the display, wherein the driving TFT includes: a first oxide semiconductor pattern; a second gate electrode disposed over the first oxide semiconductor pattern and overlaps the first oxide semiconductor pattern; and a shield pattern disposed between the second gate electrode and the first oxide semiconductor pattern.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 6A is a table illustrating the relationship between the concentration of impurities with which the shield pattern is doped and an S-factor according to one embodiment of the present disclosure;

FIG. 6B is a table illustrating the relationship between the number of shield patterns and an S-factor according to one embodiment of the present disclosure; and FIGS. 7A and 7B are a cross-sectional view and a circuit diagram illustrating the relationship between parasitic capacitances generated inside the driving TFT of the present disclosure according to one embodiment of the present disclosure.

DETAILED DESCRIPTION

Figure 1:
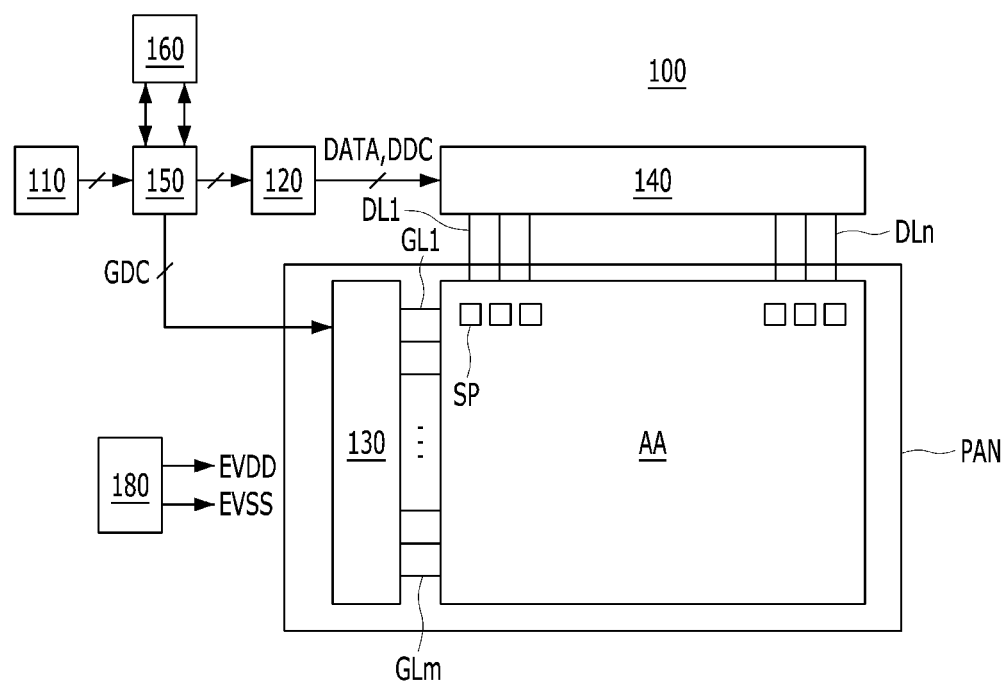
FIG. 1 is a schematic block diagram of an organic light-emitting display apparatus according to one embodiment of the present disclosure.

The advantages and features of the present disclosure, and the method for achieving the advantages and features will become apparent with reference to embodiments described below in detail in conjunction with the accompanying drawings. However, the present disclosure is not limited to the embodiments disclosed below and may be implemented in a variety of different forms, and these embodiments allow the disclosure of the present disclosure to be complete and are merely provided to fully inform those of ordinary skill in the art to which the present disclosure belongs of the scope of the invention.

The shapes, sizes, proportions, angles, numbers, etc. disclosed in the drawings for describing the embodiments of the present disclosure are illustrative, and thus the present disclosure is not limited to the illustrated elements. The same reference symbol refers to the same element throughout the specification. In addition, in describing the present disclosure, when it is determined that a detailed description of a related known technology may unnecessarily obscure the subject matter of the present disclosure, such a detailed description will be omitted. When "including", "having", "comprising", etc. are used in this specification, other parts may also be present, unless "only" is used. When an element is expressed in the singular, the case including the plural is included unless otherwise explicitly stated.

In interpreting an element, it is to be interpreted as including an error range even when there is no separate explicit description thereof.

In the case of a description of a positional relationship, for example, when a positional relationship between two parts is described using "on", "above", "below", "next to", etc., one or more other parts may be located between the two parts, unless "immediately" or "directly" is used.

In the case of a description of a temporal relationship, for example, when a temporal relationship is described with "after", "subsequent to", "next", "before", etc., the discontinuous case may be included unless "immediately" or "directly" is used.

Although "first", "second", etc. are used to describe various elements, these elements are not limited by these terms. These terms are merely used to distinguish one element from another. Accordingly, a first element mentioned below may be a second element within the spirit of the present disclosure.

Respective features of the various embodiments of the present disclosure may be partially or wholly united or combined with each other, various types of interlocking and driving are technically possible, and the respective embodiments may be implemented independently of each other, or may be implemented together in an interrelated relationship.

Hereinafter, the present disclosure will be described in detail with reference to the accompanying drawings.

Figure 2:
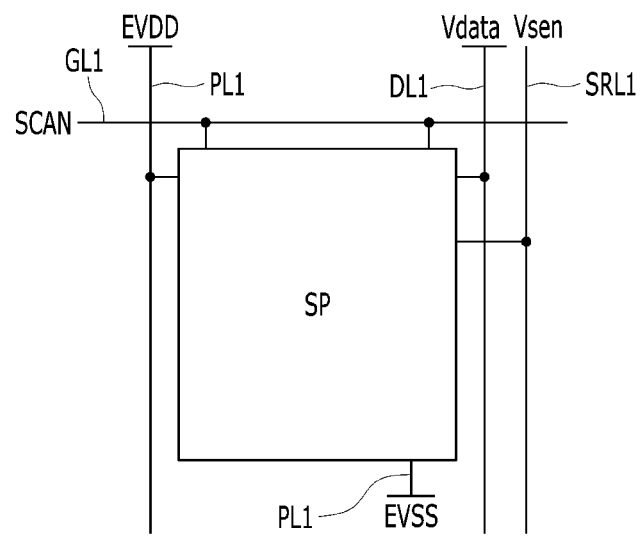
FIG. 2 is a schematic block diagram of a subpixel of the organic light-emitting display apparatus according to one embodiment of the present disclosure.

FIG. 1 is a schematic block diagram of an organic light-emitting display apparatus 100 according to one embodiment of the present disclosure, and FIG. 2 is a schematic block diagram of a subpixel SP illustrated in FIG. 1 according to one embodiment of the present disclosure.

As illustrated in FIG. 1, the organic light-emitting display apparatus 100 includes an image-processing unit 110 (e.g., a circuit), a degradation compensator 150 (e.g., a circuit), a memory 160, a timing controller 120, a data driver 140, a power supply unit 180 (e.g., a circuit), and a display panel PAN in which a gate driver 130 is formed.

The image-processing unit 110 outputs a driving signal for driving various devices together with image data supplied from the outside. For example, the driving signal output from the image-processing unit 110 may include a data enable signal, a vertical synchronization signal, a horizontal synchronization signal, and a clock signal.

The degradation compensator 150 calculates a degradation compensation gain value of the subpixel SP of the display panel based on a sensing voltage Vsen supplied from the data driver 140, calculates a dimming weight value based on the calculated degradation compensation gain value, then modulates input image data Idata of each subpixel SP in a current frame by the calculated degradation compensation gain value and dimming weight value, and then supplies the modulated image data Idata to the timing controller 120.

The timing controller 120 is supplied with a driving signal, etc. along with the image data modulated by the deterioration compensator 150. The timing controller 120 generates and outputs a gate timing control signal GDC for controlling the operation timing of the gate driver 130 and a data timing control signal DDC for controlling the operation timing of the data driver 140 based on the driving signal input from the image-processing unit 110.

In addition, the timing controller 120 controls the operation timings of the gate driver 130 and the data driver 140 to acquire at least one sensing voltage Vsen from each subpixel SP and supplies the acquired sensing voltage Vsen to the degradation compensator 150.

The gate driver 130 outputs a scan signal to the display panel PAN in response to the gate timing control signal GDC supplied from the timing controller 120. The gate driver 130 outputs the scan signal through a plurality of gate lines GL1 to GLm. At this time, the gate driver 130 may take the form of an integrated circuit (IC). However, the present disclosure is not limited thereto. In particular, the gate driver 130 may have a gate-in-panel (GIP) structure formed by directly stacking a TFT on a substrate inside the organic light-emitting display apparatus 100. The GIP may include a plurality of circuits such as a shift register and a level shifter.

The data driver 140 outputs a data voltage to the display panel PAN in response to the data timing control signal DDC input from the timing controller 120. The data driver 140 samples and latches a digital data signal DATA supplied from the timing controller 120 to convert the data signal into an analog data voltage based on a gamma voltage. The data driver 140 outputs the data voltage through a plurality of data lines DL1 to DLn.

In addition, the data driver 140 supplies the sensing voltage Vsen input from the display panel PAN to the deterioration compensator 150 through a sensing voltage readout line.

At this time, the data driver 140 may be mounted on the display panel PAN in the form of an integrated circuit (IC), and may be formed by stacking various patterns and layers directly on the display panel PAN. However, the present disclosure is not limited thereto.

The power supply unit 180 outputs a high-potential driving voltage EVDD and a low-potential driving voltage EVSS and supplies the voltages to the display panel PAN. The high-potential driving voltage EVDD and the low-potential driving voltage EVSS are supplied to the display panel PAN through a power line. At this time, the voltages output from the power supply unit 180 may be output to the data driver 140 or the gate driver 130 and used for driving the driver.

The display panel PAN displays an image in response to the data voltage and the scan signal supplied from the data driver 140 and the gate driver 130, and the power supplied from the power supply unit 180.

The display panel PAN includes a plurality of subpixels SP so that an actual image is displayed. The subpixels SP include red subpixels, green subpixels and blue subpixels or include white (W) subpixels, red (R) subpixels, green (G) subpixels, and blue (B) subpixels. Here, the W, R, G, and B subpixels SP may all have the same area, or may have different areas.

The memory 160 stores a lookup table for the deterioration compensation gain and stores a deterioration compensation time of an organic light-emitting device of the subpixel SP. At this time, the deterioration compensation time of the organic light-emitting device may be the number of driving operations or the driving time of an organic electroluminescent display panel.

As illustrated in FIG. 2, one subpixel SP may be connected to a gate line GL1, a data line DL1, a sensing voltage readout line SRL1, and a power line PL1. The number of transistors and capacitors and a driving method of the subpixel SP are determined according to a circuit configuration.

Figure 3:
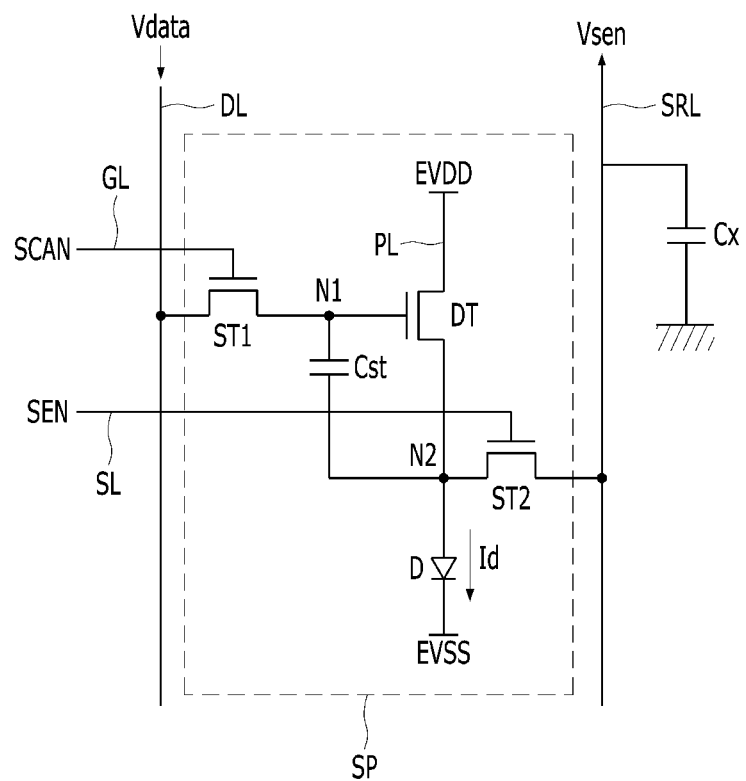
FIG. 3 is a circuit diagram of the subpixel of the organic light-emitting display apparatus according to one embodiment of the present disclosure.

FIG. 3 is a circuit diagram illustrating the subpixel SP of the organic light-emitting display apparatus 100 according to one embodiment of the present disclosure.

As illustrated in FIG. 3, the organic light-emitting display apparatus 100 according to the present disclosure includes a gate line GL, a data line DL, a power line PL, and a sensing line SL, which intersect each other to define the subpixel SP, and the subpixel SP includes a driving TFT DT, an organic light-emitting device D, a storage capacitor Cst, a first switch TFT ST1, and a second switch TFT ST2.

The organic light-emitting device D includes an anode electrode connected to a second node N2, a cathode electrode connected to an input terminal of the low-potential driving voltage EVSS, and an organic light-emitting layer positioned between the anode electrode and the cathode electrode.

The driving TFT DT controls a current Id flowing through the organic light-emitting device D according to a gate-source voltage Vgs. The driving TFT DT includes a gate electrode connected to a first node N1, a drain electrode connected to the power line PL to provide the high-potential driving voltage EVDD, and a source electrode connected to the second node N2.

The storage capacitor Cst is connected between the first node N1 and the second node N2.

When the display panel PAN is driven, a first switch TFT ST1 applies a data voltage Vdata, with which the data line DL is charged, to the first node N1 in response to a gate signal SCAN to turn ON the driving TFT DT. Here, the first switch TFT ST1 includes a gate electrode connected to the gate line GL to receive a scan signal SCAN, a drain electrode connected to the data line DL to receive the data voltage Vdata, and a source electrode connected to the first node N1.

The second switch TFT ST2 switches a current between the second node N2 and the sensing voltage readout line SRL in response to the sensing signal SEN, thereby storing a source voltage of the second node N2 in a sensing capacitor Cx of the sensing voltage readout line SRL. When the display panel PAN is driven, the second switch TFT ST2 switches a current between the second node N2 and the sensing voltage readout line SRL in response to the sensing signal SEN, thereby resetting a source voltage of the driving TFT DT to an initialization voltage Vpre. At this time, in the second switch TFT ST2, a gate electrode is connected to the sensing line SL, a drain electrode is connected to the second node N2, and a source electrode is connected to the sensing voltage readout line SRL.

Meanwhile, in the drawings, an organic light-emitting display apparatus having a 3T1C structure including three TFTs and one storage capacitor has been illustrated and described. However, the organic light-emitting display apparatus of the present disclosure is not limited to this structure, and may be applied to various structures, such as 4T1C, 5T1C, 6T1C, 7T1C, and 8T1C.

As such, the TFTs disposed in the GIP structure and the TFTs disposed in the subpixel have different functions, and thus need to have different operating characteristics. In more detail, in the GIP circuit part, a high-speed operation characteristic is necessary, and in the subpixel, there may be a need for a driving TFT that requires rich grayscale expression even in low-speed operation depending on the function, and there may be a need for a switching element that has fast operation characteristics and effectively blocks leakage current in an OFF state.

Accordingly, the organic light-emitting display apparatus according to the present disclosure intends to provide a TFT optimized for each function.

Figure 4:
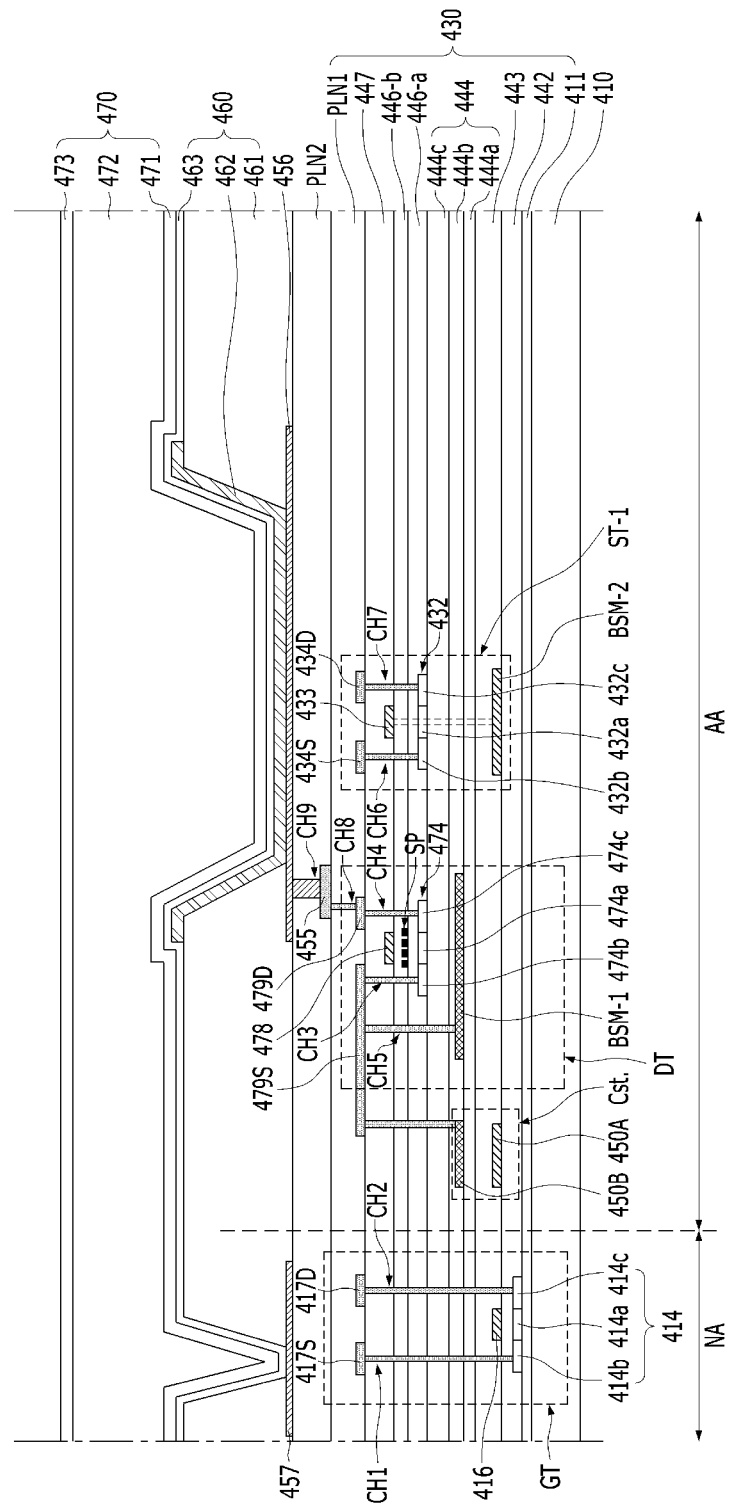
FIG. 4 is a cross-sectional view illustrating an example of one TFT disposed in a gate-driving circuit part of a non-display region and a driving TFT and a switching TFT disposed in a display region according to one embodiment of the present disclosure.

FIG. 4 is a cross-sectional view illustrating one first TFT GT as a representative of TFTs disposed in the non-display region NA, particularly a GIP region, a driving TFT DT disposed in a subpixel of a display region AA to drive the organic electroluminescent element, a first switching TFT ST-1, and the storage capacitor Cst.

As illustrated in FIG. 4, the driving TFT DT and the first switching TFT ST-1 are disposed in a subpixel on a substrate 410. At this time, although FIG. 4 illustrates the driving TFT DT and one switching TFT ST-1, this disclosure is for convenience of description, and a plurality of switching TFTs may actually be disposed on the substrate 410.

In addition, a plurality of first TFTs GT included in the gate-driving circuit part is disposed in the non-display region NA of the substrate 410.

The first TFT GT includes a first polycrystalline semiconductor pattern 414 disposed on a lower buffer layer 411 formed on the substrate 410, a first gate-insulating layer 442 insulating the first polycrystalline semiconductor pattern 414, a first gate electrode 416 disposed on the first gate-insulating layer 442 to overlap the first polycrystalline semiconductor pattern 414, a plurality of insulating layers formed on the first gate electrode 416, a first source electrode 417S and a first drain electrode 417D disposed on the plurality of insulating layers.

The substrate 410 may be configured as a multilayer substrate in which an organic layer and an inorganic layer are alternately stacked. For example, the substrate 410 may be formed by alternately stacking an organic layer such as polyimide and an inorganic layer such as silicon oxide ($SiO_2$).

The lower buffer layer 411 is formed on the substrate 410. The lower buffer layer 411 serves to block or at least reduce moisture, etc. that may enter from the outside, and a silicon oxide ($SiO_2$) film may be stacked in multiple layers and used as the lower buffer layer 411.

The first polycrystalline semiconductor pattern 414 is formed on the lower buffer layer 411. The first polycrystalline semiconductor pattern 414 is made of a polycrystalline semiconductor, and includes a first channel region 414a through which charges move, and a first source region 414b and a first drain region 414c adjacent to the first channel region 414a with the first channel region 414a interposed therebetween. The first source region 414b and the first drain region 414c are conductive regions obtained by doping an intrinsic polycrystalline semiconductor pattern with impurity ions such as phosphorus (P) or boron (B).

The first polycrystalline semiconductor pattern 414 includes the first channel region 414a, and the first source region 414b and the first drain region 414c adjacent to the first channel region 414a with the first channel region 414a interposed therebetween.

The first gate-insulating layer 442 is formed by depositing an inorganic insulating layer such as silicon oxide ($SiO_2$) on the entire surface of the substrate 410 on which the first polycrystalline semiconductor pattern 414 is formed. The first gate-insulating layer 442 protects and insulates the first polycrystalline semiconductor pattern 414 from the outside.

The first gate electrode 416 may be made of a metal material. For example, the first gate electrode 416 may have a single layer or multiple layers made of any one or an alloy of molybdenum (Mo), aluminum (Al), chromium (Cr), gold (Au), titanium (Ti), nickel (Ni), neodymium (Nd), and copper (Cu). However, the present disclosure is not limited thereto.

The first gate electrode 416 is disposed on the first gate-insulating layer 442 to overlap the first channel region 414a.

A plurality of insulating layers may be interposed between the first gate electrode 416, and the first source electrode 417S and the first drain electrode 417D.

Referring to FIG. 4, the plurality of insulating layers may be a first interlayer insulating layer 443 in contact with an upper surface of the first gate electrode 416, and an upper buffer layer 444, a second gate-insulating layer 446-a, a third gate-insulating layer 446-b, and a second interlayer insulating layer 447 sequentially stacked thereon.

The first source electrode 417S and the first drain electrode 417D are disposed on the second interlayer insulating layer 447. The first source electrode 417S and the first drain electrode 417D are connected to the first source region 414b and the first drain region 414c through a first contact hole CH1 and a second contact hole CH2, respectively, penetrating the first gate-insulating layer 442, the first interlayer insulating layer 443, the upper buffer layer 444, the second gate-insulating layer 446-a, the third gate-insulating layer 446-b, and the second interlayer insulating layer 447.

Meanwhile, the driving TFT DT, the first switching TFT ST-1, and the storage capacitor Cst are disposed in the subpixel of the display region AA.

The driving TFT DT is formed on the upper buffer layer 444.

In an embodiment of the present disclosure, the driving TFT DT includes a first oxide semiconductor pattern 474, a second gate electrode 478 overlapping the first oxide semiconductor pattern 474, a second source electrode 479S, and a second drain electrode 479D.

An oxide semiconductor material may be made of an oxide of a metal such as zinc (Zn), indium (In), gallium (Ga), tin (Sn), or titanium (Ti), or a combination of a metal such as zinc (Zn), indium (In), gallium (Ga), tin (Sn), or titanium (Ti) and an oxide thereof. More specifically, the oxide semiconductor material may include zinc oxide (ZnO), zinc-tin oxide (ZTO), zinc-indium oxide (ZIO), indium oxide (InO), titanium oxide (TiO), indium-gallium-zinc oxide (IGZO), indium-zinc-tin oxide (IZTO), etc.

Conventionally, for a driving TFT, a polycrystalline semiconductor pattern advantageous for high-speed operation has been used as an active layer. However, the driving TFT including the polycrystalline semiconductor pattern has a major problem in that, in an OFF state, leakage current is generated and power is consumed. In particular, the problem of power consumption in the OFF state becomes more problematic when a display device operates at a low speed, for example, in the case of a still image displaying a document screen. Accordingly, the embodiment of the present disclosure proposes a driving TFT using an oxide semiconductor pattern, which is advantageous for blocking leakage current, as an active layer.

However, in the case of a TFT using an oxide semiconductor pattern as an active layer, a current fluctuation value with respect to a unit voltage fluctuation value is large due to the material characteristics of an oxide semiconductor, and thus defects frequently occur in a low-gray level region where precise current control is required. Accordingly, the embodiment of the present disclosure provides a driving TFT in which a fluctuation value of a current in an active layer is relatively insensitive to a fluctuation value of a voltage applied to a gate electrode. That is, it is necessary to increase an S-factor value of the driving TFT. The driving TFT according to the embodiment of the present disclosure may reduce an effective voltage flowing through the first oxide semiconductor pattern 474 by adding a shield pattern SP, which shields an electric field applied to the first oxide semiconductor pattern 474 from a gate voltage applied to the second gate electrode 478 so as to realize an electric-field-shielding effect, and reducing the value $C_{gi}$ of a parasitic capacitance generated between the second gate electrode 478 and the first oxide semiconductor pattern 474, which will be described in detail below.

For reference, an S-factor is commonly referred to as a "subthreshold slope" and represents a voltage that is required to increase a current tenfold. In a graph (I-V curve) representing a characteristic of a drain current with respect to a gate voltage, the S-factor is an inverse value of a slope of the graph in a region below a threshold voltage.

A small S-factor means that the slope of the characteristic graph (I-V) of the drain current with respect to the gate voltage is large, and thus allows the TFT to be turned ON even by a small voltage. Accordingly, the switching characteristics of the TFT are improved. On the other hand, since the threshold voltage is reached in a short time, it is difficult to express sufficient grayscale.

A large S-factor means that the slope of the characteristic graph (I-V) of the drain current with respect to the gate voltage is small, and thus causes a decrease in an ON/OFF reaction speed of the TFT. Accordingly, the switching characteristics of the TFT deteriorate. However, since the threshold voltage is reached over a relatively long period of time, sufficient grayscale expression is possible.

In addition, the first oxide semiconductor pattern 474, which is the active layer, includes a second channel region 474a, through which charges move, and a second source region 474b and a second drain region 474c, adjacent to the second channel region 474a with the second channel region 474a interposed therebetween.

The second channel region 474a may be formed of an intrinsic oxide semiconductor that is not doped with impurities. In addition, the second source region 474b and the second drain region 474c are conductive regions obtained by doping the intrinsic oxide semiconductor with group 3 or group 5 impurity ions.

Meanwhile, a first light-blocking pattern BSM-1 is formed below the first oxide semiconductor pattern 474. The first light-blocking pattern BSM-1 may be a metal pattern that blocks external light to prevent the first oxide semiconductor pattern 474 from being irradiated with external light and malfunctioning.

Substantially, the first light-blocking pattern BSM-1 is inserted into the upper buffer layer 444. However, in the embodiment of the present disclosure, the use of a plurality of sub-upper buffer layers is illustrated. That is, in the upper buffer layer 444, a first sub-upper buffer layer 444a, a second sub-upper buffer layer 444b, and a third sub-upper buffer layer 444c may be sequentially stacked. The first light-blocking pattern BSM-1 is formed on the first sub-upper buffer layer 444a disposed on the first interlayer insulating layer 443. In addition, the second sub-upper buffer layer 444b completely covers the first light-blocking pattern BSM-1 from the top, and the third sub-upper buffer layer 444c is formed on the second sub-upper buffer layer 444b.

The first sub-upper buffer layer 444a and the third sub-upper buffer layer 444c may be formed of silicon oxide ($SiO_2$).

The first sub-upper buffer layer 444a and the third sub-upper buffer layer 444c are made of silicon oxide ($SiO_2$), which does not include hydrogen particles, so that it is possible to protect the oxide semiconductor pattern, reliability of which may be damaged due to penetration of hydrogen particles during a heat treatment process.

On the other hand, the second sub-upper buffer layer 444b may be made of silicon nitride (SiNx), having excellent ability to trap hydrogen particles. The second sub-upper buffer layer 444b may be partially formed on the first sub-upper buffer layer 444a so as to cover both an upper surface and a side surface of the first light-blocking pattern BSM-1 to completely seal the first light-blocking pattern BSM-1, or the second sub-upper buffer layer 444b may be formed on the entire surface of the first sub-upper buffer layer 444a on which the first light-blocking pattern BSM-1 is formed. Silicon nitride (SiNx) has a better ability to trap hydrogen particles than that of silicon oxide ($SiO_2$). That is, when a hydrogenation process of introducing hydrogen particles into the first polycrystalline semiconductor pattern 414 of the first TFT GT is performed, the second sub-upper buffer layer 444b, including silicon nitride, collects hydrogen particles generated in the first interlayer insulating layer 443 so as to protect oxide semiconductor patterns thereon from hydrogen particles. When hydrogen particles enter the oxide semiconductor pattern, a problem occurs in which oxide semiconductors have different threshold voltages or different channel conductivities depending on the formation positions. In particular, in the case of a driving TFT, it is important to ensure reliability since the driving TFT directly contributes to the operation of the light-emitting element.

Accordingly, in the embodiment of the present disclosure, by partially or entirely forming the second sub-upper buffer layer 444b covering the first light-blocking pattern BSM-1 on the first sub-upper buffer layer 444a, it is possible to prevent or at least reduce damage to the reliability of the driving TFT DT due to the hydrogen particles.

In addition, in the embodiment of the present disclosure, the first light-blocking pattern BSM-1 may be a metal layer including a titanium (Ti) material having excellent ability to trap hydrogen particles. For example, the metal layer may be a single layer of titanium, multiple layers of molybdenum (Mo) and titanium (Ti), or an alloy of molybdenum (Mo) and titanium (Ti). However, the present disclosure is not limited thereto, and other metal layers including titanium (Ti) may be adopted.

Titanium (Ti) traps hydrogen particles diffusing in the upper buffer layer 444 to prevent or at least reduce the hydrogen particles from reaching the first oxide semiconductor pattern 474. Therefore, in the driving TFT DT according to the embodiment of the present disclosure, the first light-blocking pattern BSM-1 is formed with a metal layer such as titanium, having ability to trap hydrogen particles, and the first light-blocking pattern BSM-1 is covered with a silicon nitride (SiNx) layer, having the ability to trap hydrogen particles, so that it is possible to relieve the problem in which the reliability of the oxide semiconductor pattern is decreased by the hydrogen particles.

The second sub-upper buffer layer 444b including silicon nitride (SiNx) is not deposited on the entire surface of the display region unlike the first sub-upper buffer layer 444a, and may be deposited only on a portion of an upper surface of the first sub-upper buffer layer 444a so as to be able to selectively cover only the first light-blocking pattern BSM-1.

The second sub-upper buffer layer 444b is formed of a material different from that of the first sub-upper buffer layer 444a, that is, a silicon nitride (SiNx) film. Thus, when the second sub-upper buffer layer 444b is deposited on the entire surface of the display region, film lifting may occur. To address this problem, the second sub-upper buffer layer 444b may be selectively formed only on a necessary portion, that is, only at a position where the first light-blocking pattern BSM-1 is formed.

In one embodiment, the first light-blocking pattern BSM-1 and the second sub-upper buffer layer 444b are formed vertically below the first oxide semiconductor pattern 474 so as to overlap the first oxide semiconductor pattern 474, in terms of the functions thereof. In addition, the first light-blocking pattern BSM-1 may be formed to be larger than the first oxide semiconductor pattern 474 so as to completely overlap the first oxide semiconductor pattern 474.

Meanwhile, the second source electrode 479S of the driving TFT DT may be electrically connected to the first light-blocking pattern BSM-1. When the first light-blocking pattern BSM-1 is electrically connected to the second source electrode 479S, the following additional effect may be obtained.

This effect will be described in detail with reference to FIGS. 7A and 7B.

In the first oxide semiconductor pattern 474, since the second source region 474b and the second drain region 474c are doped with impurities, a parasitic capacitance $C_{act}$ is generated inside the first oxide semiconductor pattern 474, a parasitic capacitance $C_{gi}$ is generated between the second gate electrode 478 and the first oxide semiconductor pattern 474, and a parasitic capacitance $C_{buf}$ is generated between the first light-blocking pattern BSM-1, which is electrically connected to the second source electrode 479S and the first oxide semiconductor pattern 474.

The first oxide semiconductor pattern 474 and the first light-blocking pattern BSM-1 are electrically connected to each other through the second source electrode 479S, and thus the parasitic capacitance $C_{act}$ and the parasitic capacitance $C_{buf}$ are connected to each other in parallel, and the parasitic capacitance Get and the parasitic capacitance $C_{gi}$ are connected in series. In addition, when a gate voltage of $V_{gat}$ is applied to the second gate electrode 478, the effective voltage $V_{eff}$ ($\Delta V$) that is actually applied to the first oxide semiconductor pattern 474 satisfies the following Equation 1.

$$\Delta V = C_{gi}/(C_{gi}+C_{act}+C_{buf}) \times \Delta V_{gat}$$ [Equation 1]

Accordingly, the effective voltage $\Delta V$ applied to the second channel region 474a is in inverse proportion to the parasitic capacitance $C_{buf}$, and thus the effective voltage applied to the first oxide semiconductor pattern 474 may be adjusted by adjusting the parasitic capacitance $C_{buf}$.

That is, when the first light-blocking pattern BSM-1 is disposed close to the first oxide semiconductor pattern 474 to increase the parasitic capacitance $C_{buf}$, the actual value of the current flowing through the first oxide semiconductor pattern 474 may be reduced.

The reduction in the effective value of the current flowing through the first oxide semiconductor pattern 474 means that a control range of the driving TFT DT, which may be controlled using voltage $V_{gat}$ actually applied to the second gate electrode 478, is widened.

That is, when the second source electrode 479S of the driving TFT DT and the first light-blocking pattern BSM-1 are electrically connected, the organic electroluminescent element may be precisely controlled even at low gray levels, and thus it is possible to solve a problem of screen unevenness that frequently occurs at low gray levels.

In addition, in the driving TFT DT, the second gate electrode 478 is disposed on the first oxide semiconductor pattern 474. The second gate electrode 478 may overlap the second channel region 474a. The second gate-insulating layer 446-a and the third gate-insulating layer 446-b are interposed between the second gate electrode 478 and the first oxide semiconductor pattern 474.

The second source electrode 479S and the second drain electrode 479D are formed on the second gate electrode 478.

The second interlayer insulating layer 447 may be interposed between the second source electrode 479S and the second drain electrode 479D, and the second gate electrode 478.

The second source electrode 479S is connected to the second source region 474b through a third contact hole CH3 penetrating the second gate-insulating layer 446-a, the third gate-insulating layer 446-b, and the second interlayer insulating layer 447, and the second drain electrode 479D is connected to the second drain region 474c through a fourth contact hole CH4 penetrating the second gate-insulating layer 446-a, the third gate-insulating layer 446-b, and the third interlayer insulating layer 447.

The second source electrode 479S may be electrically connected to the first light-blocking pattern BSM-1 through a fifth contact hole CH5 penetrating the second interlayer insulating layer 447, the second gate-insulating layer 446-a, the third gate-insulating layer 446-b, and the upper buffer layer 444.

In particular, the organic light-emitting display apparatus according to the embodiment of the present disclosure includes the shield pattern SP between the first oxide semiconductor pattern 474 and the second gate electrode 478.

A detailed description will be given with reference to FIGS. 5A to 6B.

Figure 5A:
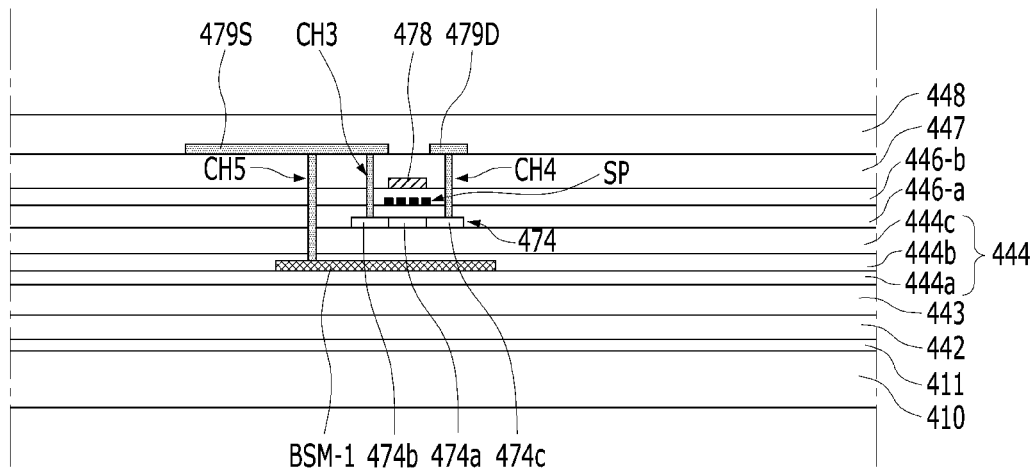
FIG. 5A is a cross-sectional view illustrating only the driving TFT according to one embodiment of the present disclosure.
Figure 5B:
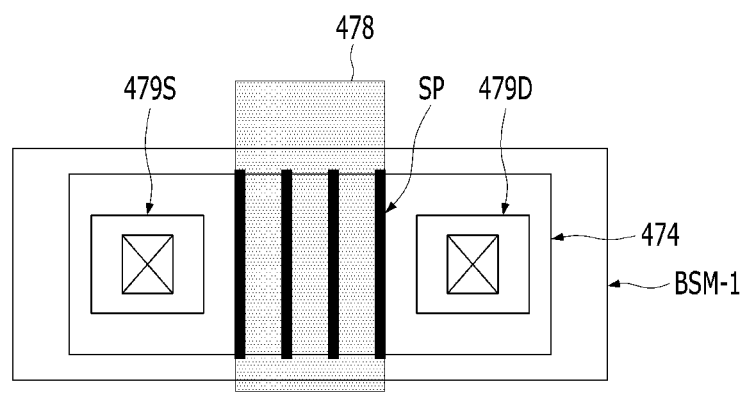
FIG. 5B is a plan view of the driving TFT of FIG. 5A according to one embodiment of the present disclosure.
Figure 5C:
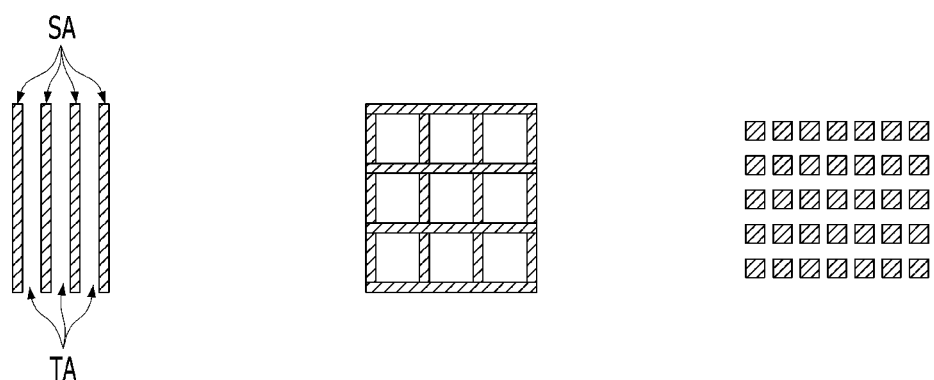
FIG. 5C is a plan view illustrating various embodiments of a shield pattern of FIG. 5A according to one embodiment of the present disclosure.

FIG. 5A is a cross-sectional view of the driving TFT DT according to one embodiment of the present disclosure, and FIG. 5B is a plan view of the driving TFT DT according to one embodiment of the present disclosure. FIG. 5C illustrates various embodiments of the shield pattern SP according to one embodiment of the present disclosure. FIG. 6A is a table illustrating the relationship between the concentration of impurities with which the shield pattern SP is doped and an S-factor value according to one embodiment of the present disclosure, and FIG. 6B is a table illustrating the relationship between the length of the shield pattern SP and an S-factor value according to one embodiment of the present disclosure.

The shield pattern SP may partially shield an electric field from being applied to the first oxide semiconductor pattern 474 when a gate voltage is applied to the second gate electrode 478. Accordingly, the voltage $V_{gat}$ actually applied from the second gate electrode 478 to the first oxide semiconductor pattern 474 may be reduced. In addition, when a gate voltage is applied to the second gate electrode 478, a charge accumulation effect in which electric charges are accumulated in the shield pattern SP occurs, thereby reducing the effective gate voltage $V_{eff}$.

In addition, referring to Equation 1 above, it may be seen that the parasitic capacitance $C_{gi}$ generated between the first gate electrode 478 and the first oxide semiconductor pattern 474 is reduced due to the shield pattern SP, so that the effective gate voltage $V_{eff}$ may be decreased.

Meanwhile, referring to FIG. 6A, it may be seen that the value of the S-factor changes according to the change in conductivity by doping the shield pattern SP with impurity ions. That is, it may be seen that as the shield pattern SP is doped with more impurity ions, that is, as the conductivity increases, the value of the S-factor increases.

In addition, referring to FIG. 6B, as a result of disposing unit shield patterns SP (for example, shield patterns having a size of 1 micrometer) while increasing the number of unit shield patterns SP, it may be seen that as the number of unit shield patterns increases, the value of the S-factor increases.

In this way, the value of the S-factor of the driving TFT DT may be adjusted by inserting the shield pattern SP between the second gate electrode 478 and the first oxide semiconductor pattern 474, and adjusting the conductivity of the shield pattern SP using the doping concentration of impurity ions or adjusting the number of unit shield patterns SP.

Referring to FIG. 5C, the electric-field-shielding effect of the shield pattern SP may be implemented through various shapes of the shield pattern SP.

That is, the shield pattern SP includes a shielding region SA that shields an electric field applied from the second gate electrode 478 and a transmissive region TA that allows the electric field to pass. Referring to FIG. 5C, the shielding region SA may have a stripe shape, a mesh shape, or a grid shape. However, the shape of the shielding region SA is not limited thereto.

The transmissive region TA, through which an electric field may pass, may be disposed between shielding regions SA.

The shield pattern SP may be a conductive metal material. However, in the present embodiment, as a result of confirming that the shielding effect varies according to the conductivity of the shield pattern SP, a silicon material may be doped with impurity ions and used, whereby the shielding effect of the shield pattern SP may be adjusted.

The silicon material may be selected from any of various silicon materials, such as polycrystalline silicon, single crystal silicon, and silicon oxide.

Meanwhile, referring to FIG. 5B, the shield pattern SP may be arranged so that an end thereof coincides with the second channel region 474a. Further, by disposing the shielding region SA more densely at an edge of the shield pattern SP than at a center of the shield pattern SP so that the shielding effect is high at the edge of the shield pattern SP, it is possible to increase the parasitic capacitance $C_{act}$ generated between an impurity doping region of the first oxide semiconductor pattern 474 (the second source region 474b and the second drain region 474c) and the second channel region 474a. In this way, as confirmed by Equation 1, it is possible to obtain the effect of lowering the effective voltage value $V_{eff}$ by increasing the value of $C_{act}$.

In addition, the driving TFT DT may have the second gate-insulating layer 446-a and the third gate-insulating layer 446-b so that the shield pattern SP may be interposed between the second gate electrode 478 and the first oxide semiconductor pattern 474. The second gate-insulating layer 446-a and the third gate-insulating layer 446-b may be sequentially deposited. The second and third gate-insulating layers 446-a and 446-b may be inorganic layers including silicon oxide.

The shield pattern SP may be formed on the second gate-insulating layer 446-a. The shield pattern SP may be in a floating state, without being connected to another electrode.

Meanwhile, returning to FIG. 4, the subpixel includes the first switching TFT ST-1 including the oxide semiconductor pattern. The first switching TFT ST-1 may be disposed between a data wire and the driving TFT DT. Even though one switching TFT is illustrated in FIG. 4, one or more switching TFTs may be disposed in the subpixel. That is, one or more switching TFTs may be disposed according to various configurations of the pixel circuit in the subpixel, such as 3T1C, 4T1C, 5T1C, 6T1C, and 7T1C.

The first switching TFT ST-1 includes a second oxide semiconductor pattern 432, a third gate electrode 433, a third source electrode 434S, and a third drain electrode 434D.

The second oxide semiconductor pattern 432 includes a third channel region 432a, and a third source region 432b and a third drain region 432c adjacent to the third channel region 432a with the third channel region interposed therebetween.

The third gate electrode 433 is positioned on the second oxide semiconductor pattern 432 with the second gate-insulating layer 446-a and the third gate-insulating layer 446-b interposed therebetween.

The third source electrode 434S and the third drain electrode 434D are positioned on the third gate electrode 433 with the second interlayer insulating layer 447 interposed therebetween.

The third source electrode 434S and the third drain electrode 434D are connected to the third source region 432b and the third drain region 432c through a sixth contact hole CH6 and a seventh contact hole CH7, respectively, penetrating the second gate-insulating layer 446-a, the third gate-insulating layer 446-b, and the second interlayer insulating layer 447.

In addition, a second light-blocking pattern BSM-2 may be disposed below the second oxide semiconductor pattern 432.

To protect the second oxide semiconductor pattern 432 from light entering from the outside, the second light-blocking pattern BSM-2 may overlap the second oxide semiconductor pattern 432, and may be located below the second oxide semiconductor pattern 432.

The second light-blocking pattern BSM-2 may be formed on the first gate-insulating layer 442. However, since the second light-blocking pattern BSM-2 may reduce an S-factor value of the second oxide semiconductor pattern 432, in another embodiment, the second light-blocking pattern BSM-2 may not be disposed below the second oxide semiconductor pattern 432.

However, when the second light-blocking pattern BSM-2, which is the first embodiment, is disposed below the second oxide semiconductor pattern 432, the second light-blocking pattern BSM-2 may be disposed on a lower layer than that of the first light-blocking pattern BSM-1. That is, the second light-blocking pattern BSM-2 may be disposed on a lower layer than that of the first light-blocking pattern BSM-1 so that a distance between the second oxide semiconductor pattern 432 and the second light-blocking pattern BSM-2 is longer than a distance between the first light-blocking pattern BSM-1 and the first oxide semiconductor pattern 474. By disposing the second light-blocking pattern BSM-2 below the second oxide semiconductor pattern 432 and on a lower layer than that of the first light-blocking pattern BSM-1, it is possible to implement a first switching TFT ST-1 requiring a high-speed operation characteristic. Naturally, it is possible that the first switching TFT ST-1 does not include the second light-blocking pattern BSM-2.

Meanwhile, referring to FIG. 4, the subpixel further includes the storage capacitor Cst.

The storage capacitor Cst stores a data voltage applied through the data line for a certain period of time and provides the data voltage to the organic light-emitting diode.

The storage capacitor Cst includes two electrodes corresponding to each other and a dielectric disposed therebetween. The storage capacitor Cst includes a first electrode 450A of the storage capacitor made of the same material as that of the first gate electrode 416 and disposed on the same layer as that on which the first gate electrode 416 is disposed, and a second electrode 450B of the storage capacitor made of the same material as that of the first light-blocking pattern BSM-1 and disposed on the same layer on which the first light-blocking pattern BSM-1 is disposed.

The first interlayer insulating layer 443 is interposed between the first electrode 450A of the storage capacitor and the second electrode 450B of the storage capacitor.

The second electrode 450B of the storage capacitor may be electrically connected to the second source electrode 479S.

Since the first embodiment of the present disclosure includes a plurality of metal patterns and includes a plurality of contact holes, it may be necessary to reduce a mask process.

Accordingly, referring to FIG. 4, the first gate electrode 416, the first electrode 450A of the storage capacitor, and the second light-blocking pattern BSM-2 may be formed of the same material on the same layer, that is, may be formed in a single mask process.

In addition, the second electrode 450B of the storage capacitor and the first light-blocking pattern BSM-1 may be formed in a single mask process.

In addition, the first oxide semiconductor pattern 474 and the second oxide semiconductor pattern 432 may be formed in a single mask process.

In addition, the first source electrode 417S, the first drain electrode 417D, the second source electrode 479S, the second drain electrode 479D, the third source electrode 434S, and the third drain electrode 434D may be formed in a single mask process.

A single mask process conceptually includes a photolithography process including a series of processes of deposition, exposure, etching, and cleaning.

Referring to FIG. 4, a first planarization layer PLN1 is formed on the substrate 410 on which the driving TFT DT and the first switching TFT ST-1 are disposed. The first planarization layer PLN1 may be formed of an organic material such as photo acrylic, and may include a plurality of layers including an inorganic layer and an organic layer. A connection electrode 455 is formed on the first planarization layer PLN1. The connection electrode 455 electrically connects an anode electrode 456 which is an element of a light-emitting element part 460 and the driving TFT DT.

A second planarization layer PLN2 may be formed on the connection electrode 455. Similar to the first planarization layer PLN1, the second planarization layer PLN2 may be formed of an organic material such as photo acrylic, and may include a plurality of layers including an inorganic layer and an organic layer.

The anode electrode 456 electrically connected to the second drain electrode 479D of the driving TFT DT through an eighth contact hole CH8 and a ninth contact hole CH9 is formed on the second planarization layer PLN2. The anode electrode 456 includes a single layer or a plurality of layers made of a metal such as Ca, Ba, Mg, Al, or Ag, or an alloy thereof, and is connected to the second drain electrode 479D of the driving transistor DT, so that an image signal is applied from the outside. In addition to the anode electrode 456, a cathode connection electrode 457 electrically connecting a common voltage wire VSS and a cathode electrode 463 may be further provided in the non-display region NA.

A bank layer 461 is formed on the second planarization layer PLN2. The bank layer 461 is a type of barrier rib, and may prevent light of a specific color output from an adjacent subpixel from being mixed and output by partitioning each subpixel.

An organic light-emitting layer 462 is formed on the anode electrode 456 and on a portion of a region of an inclined surface of the bank layer 461. The organic light-emitting layer 462 may be formed in each subpixel and may be an R-organic light-emitting layer emitting red light, a G-organic light-emitting layer emitting green light, and a B-organic light-emitting layer emitting blue light. In addition, the organic light-emitting layer 461 may be a W-organic light-emitting layer emitting white light.

In addition to a light-emitting layer, the organic light-emitting layer 462 may include an electron injection layer and a hole injection layer for injecting electrons and holes, respectively, into the light-emitting layer, and an electron transport layer and a hole transport layer for transporting the injected electrons and holes, respectively, to the organic layer.

The cathode electrode 463 is formed on the organic light-emitting layer 462. The cathode electrode 463 may be made of a transparent conductive material such as indium tin oxide (ITO) or indium zinc oxide (IZO) or a thin metal through which visible light is transmitted, but is not limited thereto.

An encapsulation layer portion 470 is formed on the cathode electrode 463. The encapsulation layer portion 470 may include a single inorganic layer, may include two layers, that is, an inorganic layer and an organic layer, or may include three layers, namely an inorganic layer, an organic layer, and an inorganic layer. The inorganic layer may include an inorganic material such as $SiN_x$ or $SiO_2$, but is not limited thereto. In addition, the organic layer may include an organic material such as polyethylene terephthalate, polyethylene naphthalate, polycarbonate, polyimide, polyethylene sulfonate, polyoxymethylene, or polyarylate, or a mixture thereof, but is not limited thereto.

In FIG. 4, as an embodiment of the encapsulation layer portion 470, a configuration of three layers, namely an inorganic layer 471, an organic layer 472, and an inorganic layer 473, is disclosed.

A cover glass may be disposed on the encapsulation layer portion 470 and attached by an adhesive layer. As the adhesive layer, any material may be used, as long as the material has excellent adhesion, heat resistance, and water resistance, and in the present disclosure, it is possible to use a thermosetting resin such as an epoxy compound, an acrylate compound, or an acrylic rubber. In addition, a photocurable resin may be used as the adhesive layer, in which case the adhesive layer is cured by irradiating the adhesive layer with light such as ultraviolet rays.

The adhesive layer may not only bond the substrate 410 and the cover glass but also serve as an encapsulant for preventing moisture from penetrating into the organic light-emitting display apparatus.

In the cover glass, as an encapsulation cap for encapsulating the organic light-emitting display apparatus, it is possible to use a protective film, such as a polystyrene (PS) film, a polyethylene (PE) film, a polyethylene naphthalate (PEN) film, or a polyimide (PI) film, or to use glass.

Referring to FIG. 4 as the embodiment of the present disclosure, in the subpixel, one driving TFT DT using an oxide semiconductor material as an active layer and one switching TFT ST-1 using an oxide semiconductor material as an active layer are disclosed. However, the subpixel may further include a third switching TFT using a polycrystalline semiconductor material as an active layer. In addition, it is possible to adopt a form in which all TFTs disposed in the subpixels are formed of an active layer made of an oxide semiconductor material.

In the present disclosure, the driving TFT has a characteristic of blocking leakage current while having an electrical characteristic of allowing rich grayscale expression even during low-speed driving, and the switching TFT has an electrical characteristic of blocking leakage current in the OFF state while allowing fast switching, so it is possible to significantly improve the performance of the organic light-emitting display apparatus.

In addition, in the present disclosure, by partially blocking an electric field generated between the semiconductor layer and the gate electrode of the driving TFT, the value of the parasitic capacitance generated between the semiconductor layer and the gate electrode is adjusted to make the electrical characteristics of the driving TFT and the switching TFT different, and thus it is possible to realize an organic light-emitting display apparatus that is efficient in low gray level expression and still images.

The above description and the accompanying drawings are merely illustrative of the technical idea of the present disclosure, and those of ordinary skill in the art to which the present disclosure pertains may make various modifications or variations, such as combination, separation, substitution and change of configuration, within a range that does not depart from the essential characteristics of the present disclosure. Therefore, the embodiments disclosed in the present disclosure are not intended to limit the present disclosure, but merely to describe the technical spirit thereof, and the scope of the technical spirit of the present disclosure is not limited by these embodiments. The protection scope of the present disclosure should be construed based on the following claims, and all technical ideas within the scope equivalent thereto should be construed as being within the scope of the present disclosure.

What is claimed is:

1. An organic light-emitting display apparatus comprising:
    a substrate including a first region and a second region;
    a first thin film transistor in at least one of the first region and the second region;
    a second thin film transistor in the second region, the second thin film transistor including a first oxide semiconductor pattern; and
    an organic light-emitting device connected to the second thin film transistor,
    wherein the second thin film transistor includes a shield pattern between a gate electrode and the first oxide semiconductor pattern, and
    wherein the shield pattern includes a transmissive region and a shielding region.

2. The organic light-emitting display apparatus according to claim 1, wherein the first thin film transistor includes a first polycrystalline semiconductor pattern.

3. The organic light-emitting display apparatus according to claim 1, wherein the shielding region is uniformly disposed at a center and an edge of the shield pattern.

4. The organic light-emitting display apparatus according to claim 1, wherein the shielding region is more densely disposed at an edge of the shield pattern than at a center of the shield pattern.

5. The organic light-emitting display apparatus according to claim 1, wherein the shield pattern is a conductor.

6. The organic light-emitting display apparatus according to claim 5, wherein the shield pattern is a silicon layer doped with impurities.

7. The organic light-emitting display apparatus according to claim 6, wherein the silicon layer is selected from a polycrystalline semiconductor material or an oxide semiconductor material.

8. The organic light-emitting display apparatus according to claim 1, wherein the substrate includes a display region and a non-display region around the display region,
    wherein the first region is in at least one of the display region and the non-display region, and the second region is in the display region.

9. The organic light-emitting display apparatus according to claim 8, further comprising a third thin film transistor disposed in the display region, the third thin film transistor including a second oxide semiconductor pattern,
    wherein the second thin film transistor is a driving thin film transistor configured to drive a pixel, and
    wherein the third thin film transistor is a switching thin film transistor configured to apply a data signal to the second thin film transistor.

10. The organic light-emitting display apparatus according to claim 9, wherein the driving thin film transistor includes a first light-blocking pattern that overlaps the first oxide semiconductor pattern and is below the first oxide semiconductor pattern.

11. The organic light-emitting display apparatus according to claim 10, wherein the organic light-emitting display apparatus further comprises a buffer layer covering the first light-blocking pattern, the buffer layer including silicon nitride.

12. The organic light-emitting display apparatus according to claim 10, wherein the switching thin film transistor includes a second light-blocking pattern that overlaps the second oxide semiconductor pattern and is below the second oxide semiconductor pattern.

13. The organic light-emitting display apparatus according to claim 12, wherein a distance between the second oxide semiconductor pattern and the second light-blocking pattern is greater than a distance between the first light-blocking pattern and the first oxide semiconductor pattern.

14. The organic light-emitting display apparatus according to claim 10, wherein the driving thin film transistor includes a source electrode and a drain electrode disposed on the first oxide semiconductor pattern, and the source electrode is connected to the first light-blocking pattern.

15. The organic light-emitting display apparatus according to claim 14, wherein an inorganic layer comprising silicon nitride is between the first light-blocking pattern and the first oxide semiconductor pattern.

16. The organic light-emitting display apparatus according to claim 14, wherein the first light-blocking pattern comprises at least one metal layer including titanium.

17. An organic light-emitting display apparatus comprising:
    a substrate including a display region and a non-display region around the display region; and
    a driving thin film transistor in the display region,
    wherein the driving thin film transistor includes:
        a first oxide semiconductor pattern;
        a second gate electrode over the first oxide semiconductor pattern and overlapping the first oxide semiconductor pattern; and a shield pattern between the second gate electrode and the first oxide semiconductor pattern.

* * * * *